(12) United States Patent
Muralidhar et al.

(10) Patent No.: US 7,811,851 B2
(45) Date of Patent: Oct. 12, 2010

(54) PHASE CHANGE MEMORY STRUCTURES

(75) Inventors: Ramachandran Muralidhar, Mahopac, NY (US); Tushar P. Merchant, Austin, TX (US); Rajesh A. Rao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 479 days.

(21) Appl. No.: 11/864,246

(22) Filed: Sep. 28, 2007

(65) Prior Publication Data

US 2009/0085024 A1    Apr. 2, 2009

(51) Int. Cl.
*H01L 21/06* (2006.01)
*H01L 29/02* (2006.01)

(52) U.S. Cl. .............. 438/95; 438/102; 257/3; 257/4; 257/E21.001

(58) Field of Classification Search ............... 438/95, 438/102; 257/2–5, E21.001, E45.002; 365/148, 365/163
See application file for complete search history.

(56) References Cited

U.S. PATENT DOCUMENTS

| | | | |
|---|---|---|---|
| 6,917,532 B2 | 7/2005 | Van Brocklin et al. | |
| 7,115,208 B2 | 10/2006 | Hieda et al. | |
| 7,149,155 B2 | 12/2006 | Schut et al. | |
| 7,233,017 B2 | 6/2007 | Yoon et al. | |
| 7,420,199 B2 | 9/2008 | Gutsche et al. | |
| 7,465,951 B2 | 12/2008 | Scheuerlein | |
| 7,705,424 B2 * | 4/2010 | Lee et al. ............ | 257/536 |
| 2006/0006472 A1 | 1/2006 | Jiang | |
| 2006/0034116 A1 | 2/2006 | Lam | |
| 2006/0180803 A1 | 8/2006 | Suh et al. | |
| 2006/0226409 A1 | 10/2006 | Burr et al. | |
| 2006/0231970 A1 | 10/2006 | Huang et al. | |
| 2006/0273298 A1 | 12/2006 | Petti | |
| 2007/0012986 A1 | 1/2007 | Choi et al. | |
| 2007/0018342 A1 | 1/2007 | Sandhu et al. | |
| 2007/0025226 A1 | 2/2007 | Park et al. | |
| 2007/0052009 A1 | 3/2007 | Xie et al. | |
| 2007/0082495 A1 | 4/2007 | Mathew et al. | |
| 2007/0096071 A1 * | 5/2007 | Kordus et al. ............ | 257/2 |
| 2007/0132049 A1 | 6/2007 | Stipe | |
| 2007/0158697 A1 | 7/2007 | Choi et al. | |
| 2007/0257246 A1 | 11/2007 | Bakkers et al. | |

(Continued)

FOREIGN PATENT DOCUMENTS

KR    1020070025304 A    3/2007

OTHER PUBLICATIONS

Office Action issued Feb. 29, 2010 for related U.S. Appl. No. 11/864,257.

(Continued)

*Primary Examiner*—David Vu
*Assistant Examiner*—Earl N Taylor
(74) *Attorney, Agent, or Firm*—David G. Dolezal; James L. Clingan, Jr.

(57) ABSTRACT

A phase change memory cell has a first electrode, a plurality of pillars, and a second electrode. The plurality of pillars are electrically coupled with the first electrode. Each of the pillars comprises a phase change material portion and a heater material portion. The second electrode is electrically coupled to each of the pillars. In some examples, the pillars have a width less than 20 nanometers.

11 Claims, 12 Drawing Sheets

U.S. PATENT DOCUMENTS

2007/0278530 A1    12/2007    Seidl
2008/0197334 A1*   8/2008    Lung ............................. 257/2
2009/0026432 A1*   1/2009    Liu et al. ....................... 257/2

OTHER PUBLICATIONS

Office Action issued Aug. 7, 2009 for related U.S. Appl. No. 11/864,257.

International Search Report for coordinating PCT Application No. PCT/US2008/072547 mailed on Mar. 24, 2009.

Office Action issued Mar. 24, 2009 for a related U.S. Appl. No. 11/864,257.

Wong; "Nanowire Memory Cell Selection Device for 3D Cross-Point Memory Arrays"; Stanford University, USA, Oct. 2006.

Xie; "Proposal in Cross-disciplinary Semiconductor Research (CSR)"; UCLA, USA, Nov. 2005.

Galatsis et al.; "Emerging Memory Devices", IEEE Circuits & Devices Magazine, May/Jun. 2006, pp. 12-21.

Zhang et al.; "An Integrated Phase Change Memory Cell With Ge Nanowire Diode for Cross-Point Memory"; Stanford University, Stanford, CA, USA, 2007.

* cited by examiner

PHASE CHANGE MEMORY STRUCTURES

RELATED APPLICATIONS

This application is related to a patent application entitled "Phase Change Memory Structures," Ser. No. 11/864,257 having common inventors, having a common assignee, and filed herewith, all of which is incorporated by reference in its entirety.

BACKGROUND OF THE INVENTION

1. Field of the Invention

This invention relates in general to semiconductor devices and more specifically to phase change memories.

2. Description of the Related Art

A phase change memory is a memory that utilizes phase change material to store information. Information is stored in a structure of phase change material where the phase of the phase change material is indicative of the value stored in the memory cell. In one type of phase change memory, the phase change material of a memory cell may be in an amorphous stage for storing a first value and in a crystalline phase for storing a second value. Each of these different phases provides a different resistance value, which can be measured to determine the value stored.

Some types of phase change memories include heater structures for generating heat sufficient to change the phase of the phase change structure of the memory cell. Heat is generated by passing current through the heater structure, where the relatively high resistivity of the heater structure generates heat with the current passing through it. In some types of phase change memories, the amount and duration of heat generation in the heater structure controls whether the phase change material will be changed to an amorphous phase or a crystalline phase.

What is desired is an improved phase change memory cell.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

It has been discovered that providing a heater structure of a phase change memory cell with multiple pillar structures may provide in some embodiments, for a phase change memory cell with more efficient heating for changing the phase state of a phase change material.

Figure 1:
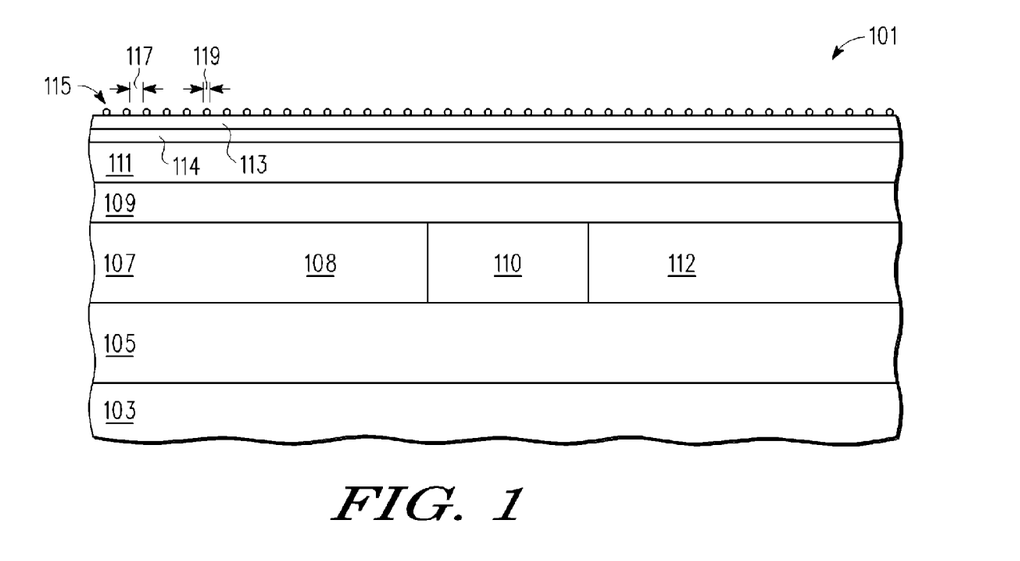
FIGS. 1-13 show side cut away views of various stages in the manufacture of phase change memory cells according to one embodiment of the present invention.

FIG. 1 is a cutaway side view of wafer 101 used to make phase change memory cells. Wafer 101 includes a substrate 103. Substrate 103 may be made of various materials, e.g. semiconductor materials (silicon, silicon germanium) or dielectric materials. In some embodiment, substrate 103 may include a bulk material or may include multiple layers of different materials such as a semiconductor on insulator (SOI) substrate.

In one embodiment, substrate 103 includes active semiconductor material in which transistors and diodes (not shown) are formed therein.

A dielectric layer 105 is located on substrate 103. In one embodiment, layer 105 includes a dielectric material e.g. silicon dioxide, TEOS. In some embodiments, transistor gates and contacts may be located at the same level as layer 105.

In the embodiment shown, layer 107 is the first metal layer of an interconnect portion of wafer 101. In other embodiments, layer 107 may be at a higher level metal layer between the first and last metal layers of the interconnect portion. Layer 107 includes conductive electrodes 108 and 112 which are separated by dielectric 110. Electrodes 108 and 112 are made of a conductive material such as copper, aluminum, or gold. Electrodes 108 and 112 may include barrier layers (not shown). In some embodiments, the first metal layer includes conductive interconnects for electrically coupling the memory cells to transistors of the wafer.

Heater material layer 109 is located on layer 107. Layer 109 is made of a heater material that generates a relatively high amount of heat when current passes through the material. Examples of heater material include titanium nitride, titanium aluminum nitride, titanium tungsten, tantalum nitride, tantalum silicon nitride, tungsten nitride. Some examples of heater material may include titanium, aluminum, nitrogen, silicon, tantalum, or tungsten. In some examples, heater material conducts current but is of a relatively high resistance such that a relatively high amount of heat is generated when current passes through. In one embodiment, layer 109 has a thickness in the range of 50-500 nanometers, but may have other thicknesses in other embodiments.

In one embodiment, layer 109 may include a conductive barrier and/or adhesion layer e.g. tantalum pentoxide, tantalum silicon nitride, or tantalum nitride (e.g. 3-5 nm) that is deposited after to the deposition of the heater material.

Phase change material layer 111 is located on layer 109. Phase change material layer is made of a material that changes phase (e.g. between an amorphous stage and crystalline phase) in response to the heat generated from the heater material layer 109. Phase change material provides a different resistive value depending upon its phase. In one embodiment, the phase change material includes of combination of at least two materials where the first material is one of a class group consisting of a group IB material, a group III material, a group IV material, a group V material, and a group VI material and the second material is one of the class group but not a same group of the class group as the first material. Examples of phase change materials include germanium antimony tellurium, germanium tellurium, germanium antimony, gallium antimony tellurium, silver indium antimony tellurium, tin selenium, tin sulfur, indium selenium, indium antimony selenium. In one embodiment, layer 111 has a thickness in the range of 20-100 nanometers but may be of other thicknesses in other embodiments.

Cap layer 114 is located on layer 111 and is made of e.g. nitride. Cap layer 114 is utilized as a polishing stop in subsequent processes. Cap layer 114 has a thickness in the range of 50-200 nanometers but may be of other thicknesses in other embodiments.

Layer 113 is located on layer 114. Layer 113 is utilized as a masking layer for patterning layers 111 and 109 in subsequent processes. In one embodiment, layer 113 is made of silicon oxide and has a thickness of 10-100 nanometers but may be of other thicknesses in other embodiments.

Nanoclusters 115 are located on layer 113. Nanoclusters 115 are discontinuous structures of a material. In one embodiment, nanoclusters 115 are silicon nanoclusters but may be of other materials (e.g. germanium or metal such as gold, palladium, platinum) in other embodiments. In one embodiment, nanoclusters have a width 119 of in the range of 3-20 nanometers but may have other widths in other embodiments. In some embodiments, the nanoclusters are spaced apart (spacing 117) in a range of 3-50 nanometers, but may be at other spacings in other embodiments.

In one embodiment, nanoclusters may be formed by chemical vapor deposition using silane or disilane as a precursor. The width 119 and spacing 117 are controlled by controlling the deposition temperature and the process time. Nanoclusters can be made larger by increasing the deposition time and can be spaced wider apart by increasing the temperature of the deposition. In one embodiment where the nanoclusters are silicon, the nanoclusters are formed by a chemical vapor deposition process at a temperature of 450-500 C and a time at temperature of 50-250 seconds to provide silicon nanoclusters having a width of 10 nm and a spacing of 12 nm.

In other embodiments, nanoclusters 115 may be prefabricated and spin coated on layer 113.

Figure 2:
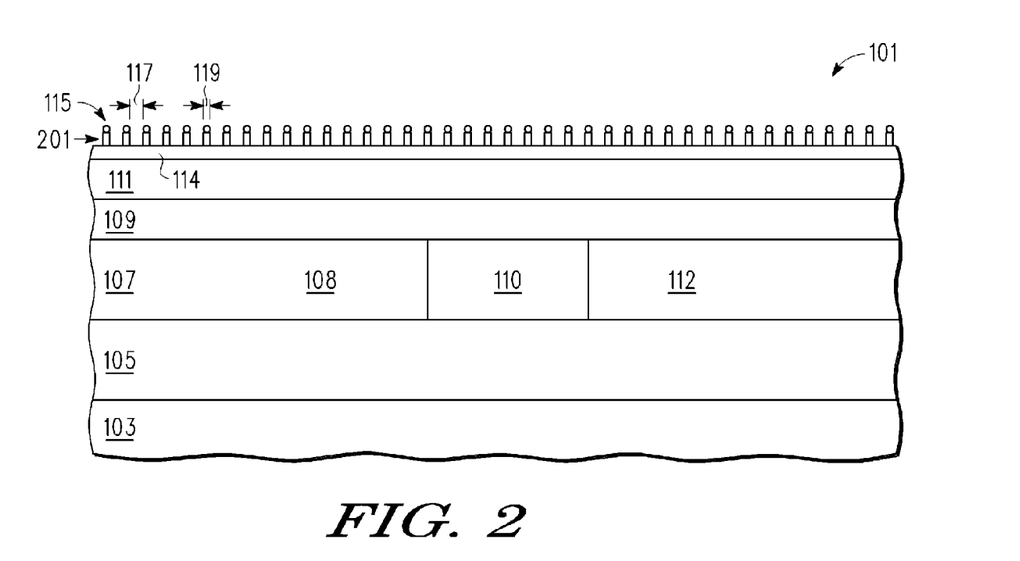

FIG. 2 shows a side view of wafer 101 after layer 113 has been patterned to form nanopillar mask structures 201 as per the pattern of nanoclusters 115 on layer 113. In one embodiment, structures 201 have a width similar to width 119 and a separation similar to spacing 117. In one embodiment, structures 201 are formed by anisotropically etching layer 113 with an etch chemistry that is selective to the material of layer 113 and selective with respect to the material of nanoclusters 115.

Figure 3:
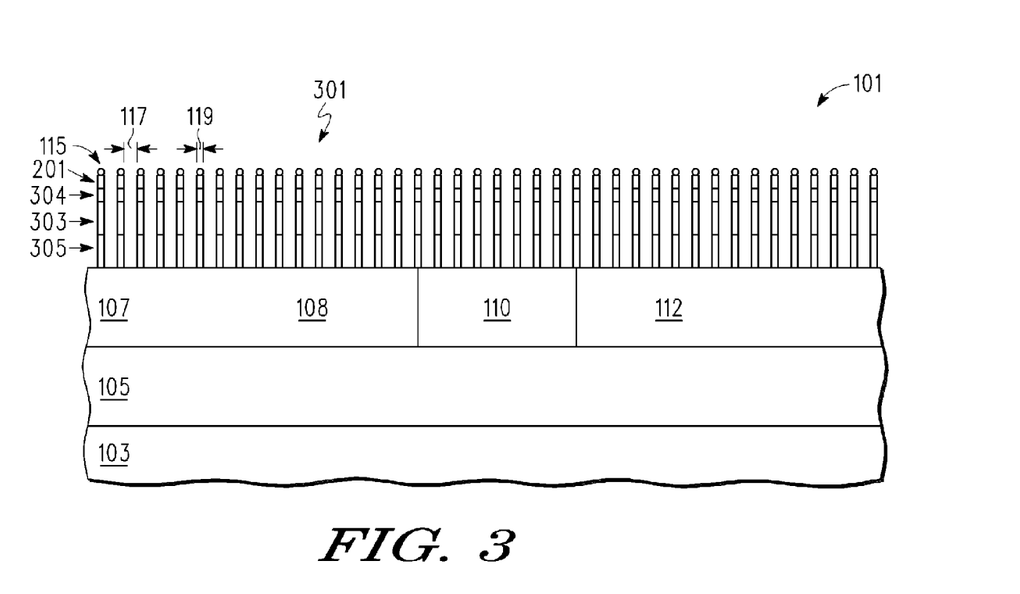

FIG. 3 shows a partial cutaway side view of wafer 101 after layers 114, 111, and 109 have been patterned as per the pattern formed from structures 201. As shown in FIG. 3, multiple pillars 301 of phase change structures 303 and heater structures 305 are formed from the patterning. These structures have relatively the same width as width 119 and the same spacing as spacing 117. Pillars 301 are formed by the anisotropic etching of layers 114, 111, and 109 with etch chemistries that are selective to those materials. For example, if layer 111 is made of germanium antimony tellurium, an etch chemistry of argon, chlorine, and $CF_4$ may be used. Where layer 109 is made titanium nitride, an etch chemistry of $CF_4$ and argon or $BCl_3$ and argon may be used.

Figure 4:
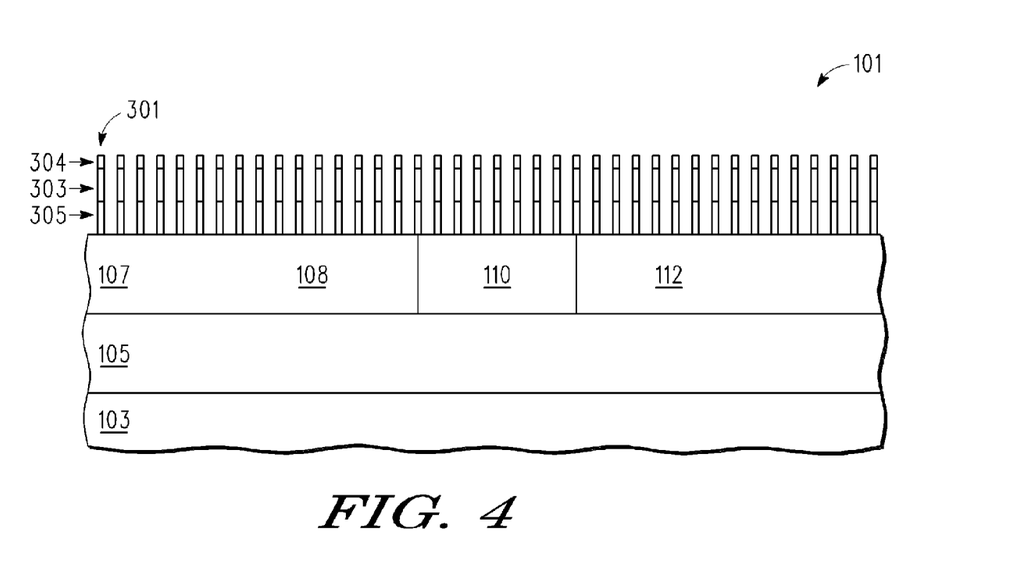

FIG. 4 shows a view of wafer 101 after structures 201 and nanoclusters 115 are removed. In one embodiment where structures 201 are made of oxide, those pillars may be remove by etching with diluted HF acid.

Figure 5:
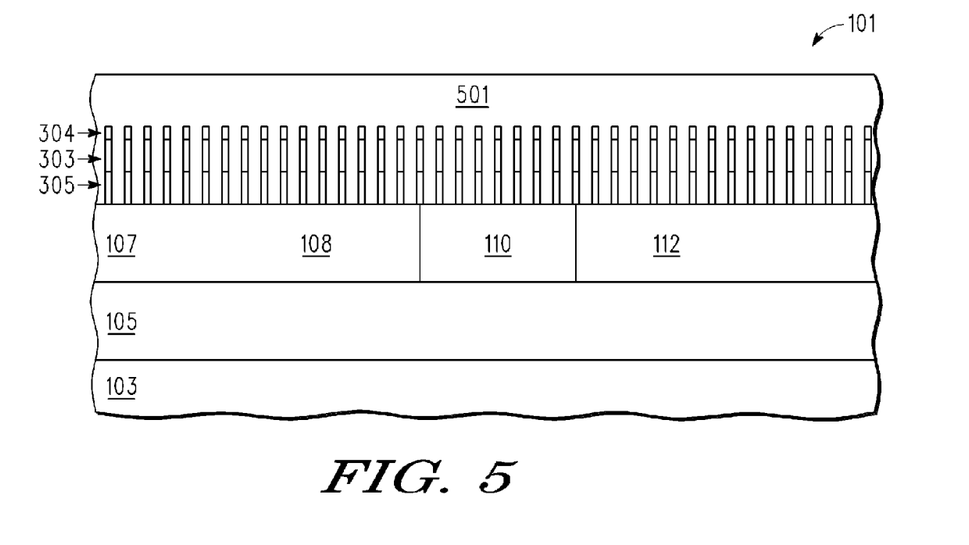

In FIG. 5, a layer 501 of dielectric material (e.g. silicon oxide, TEOS) is formed over wafer 101. In one embodiment, layer 501 is formed by a chemical vapor deposition process (CVD), but may be formed by other processes. Layer 501 is formed to level above nanopillars 301.

Figure 6:
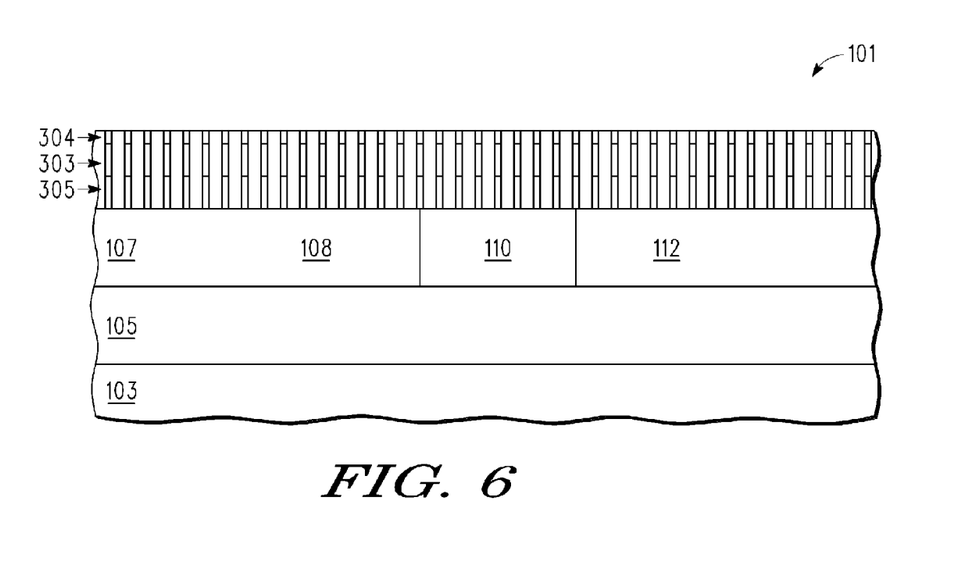

FIG. 6 shows wafer 101 after wafer 101 has been subjected to a planarizing process (e.g. chemical mechanical polish (CMP)) that utilizes structures 304 of layer 114 as a planarizing stop.

Figure 7:
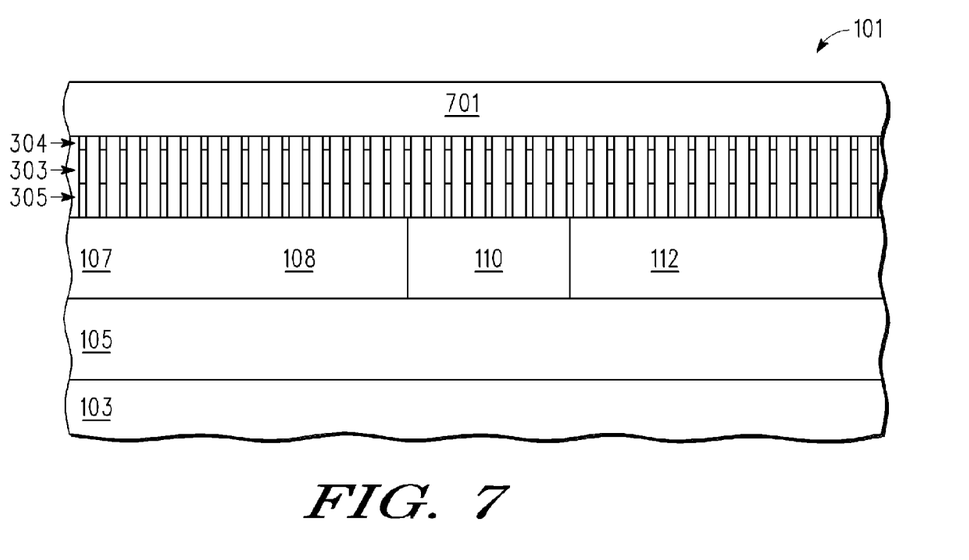

FIG. 7 shows wafer 101 after a mask layer 701 (e.g. nitride) is deposited on the planarized surface of wafer 101. In one embodiment, layer 701 has a thickness in the range of 50-100 nm but may have other thicknesses in other embodiments.

Figure 8:
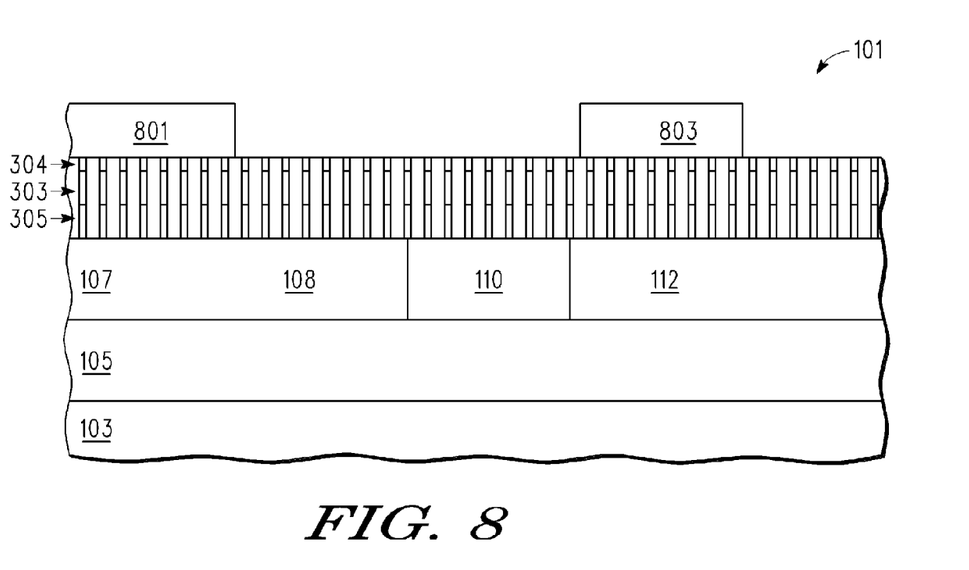

FIG. 8 shows wafer 101 after layer 701 has been patterned to form mask structures 801 and 803 which will be used to define the heater structures and phase change material structures of two phase change memory cells respectively.

Figure 9:
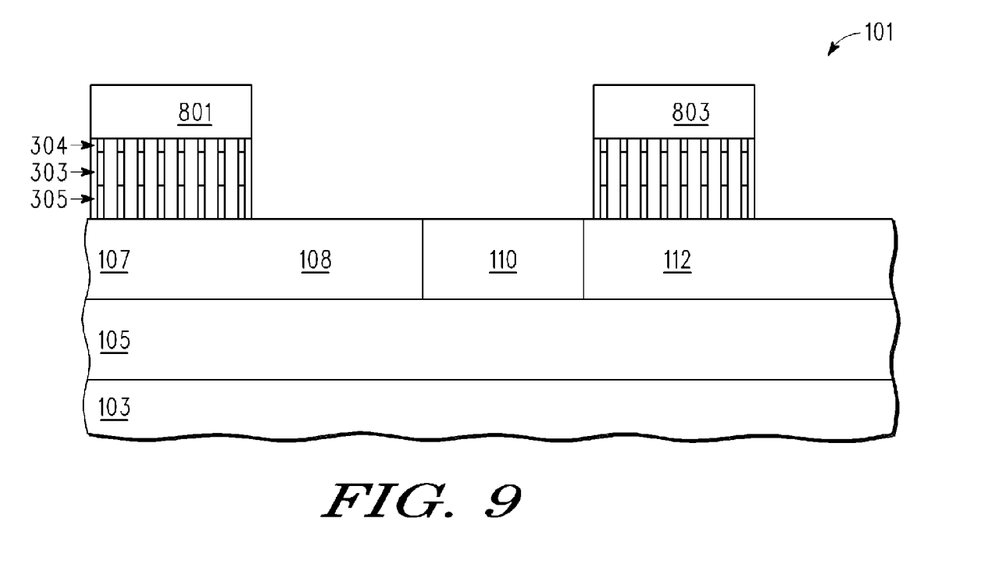

In FIG. 9, the areas of pillars 301 and layer 501 not covered by mask structures 801 and 803 are removed to expose electrodes 108 and 112 and to expose portions of dielectric 110. In one embodiment, these structures are removed with etchants that are selective to those structures. In some embodiments, the etchant used to remove layer 501 may also remove some of dielectric 110.

Figure 10:
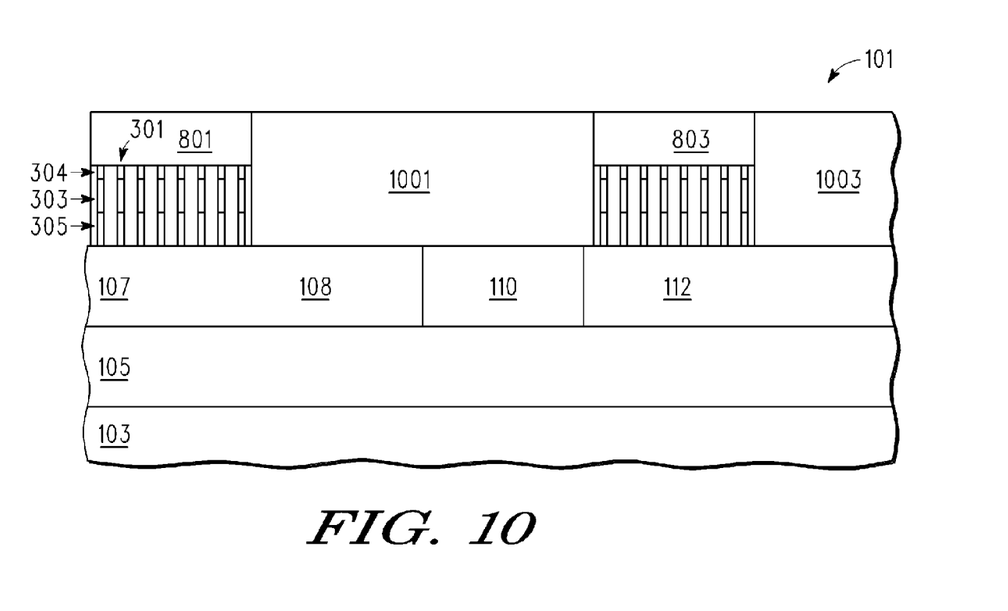

FIG. 10 shows a view of wafer 101 after a dielectric layer 1001 is formed on wafer 101 and then planarized using mask structures 801 and 803 as planarizing stops. In one embodiment, layer 1001 is made of silicon oxide or TEOS, but may be made of other materials in other embodiments.

Figure 11:
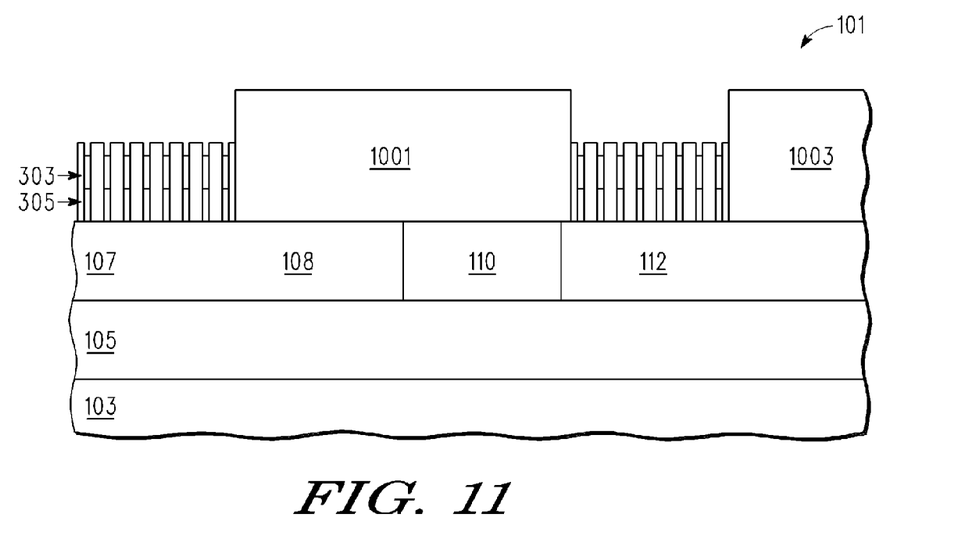

FIG. 11 shows a view of wafer 101 after masked structures 801 and 803 and cap structures 304 have been removed (e.g. with a wet etch selective to nitride) to expose the tops of structures 303 of pillars 301.

Figure 12:
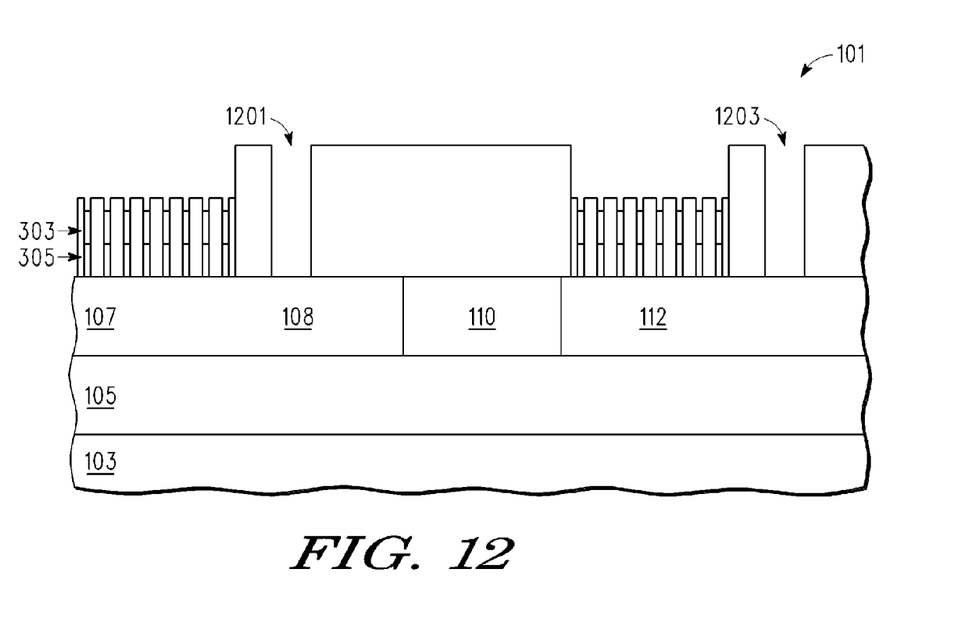

FIG. 12 shows wafer 101 after openings 1201 and 1203 are formed to expose electrodes 108 and 112 respectively. In forming openings 1201 and 1203, a masking layer (not shown) is formed over wafer 101 and patterned to form the openings.

Figure 13:
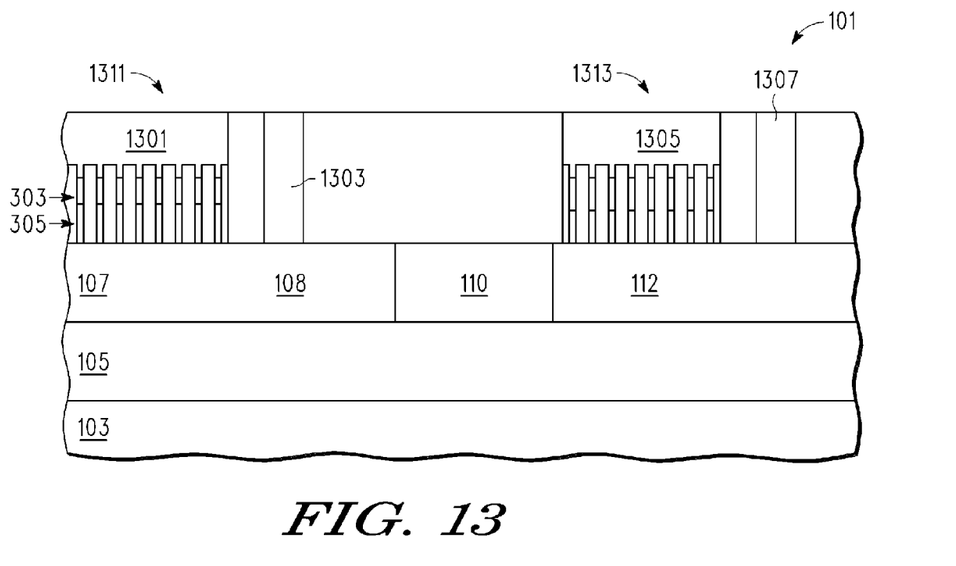

FIG. 13 shows wafer 101 after a layer of conductive material (e.g. copper, aluminum, or gold) is deposited over wafer 101 and then planarized to form electrodes 1301 and 1305 and contacts 1303 and 1307. In one embodiment, these structures may include barrier layers (not shown). In one embodiment, electrodes 1301 and 1305 may be formed as part of conductive interconnect structures of an upper metal layer (e.g. second or third metal layer) of wafer 101. In other embodiments, an upper metal layer may include conductive interconnects located over electrodes 1301 and 1305 and electrically coupled to those electrodes.

FIG. 13 shows two phase change memory cells 1311 and 1313 having a heater including multiple heater structures 305 of pillars 301 and having phase change material implemented in multiple phase change structures 303 of pillars 301.

In the embodiment shown, the memory structure of cell 1311 is written to by applying a write current to electrode 108 which flows through the heater structures 305 and phase change structures 303 to electrode 1301. A portion of the current provided to electrode 108 passes through each heater structure 305 of pillars 301 of the cell to generate heat to change the phase of its respective phase change structure 303 of its pillar. In one embodiment, to make structure 303 amorphous, a relatively high current is passed through electrode 108 for a relatively short period of time. This high current generates a relatively higher amount of heat by structures 305 for a relatively shorter duration. To make structures 303 crystalline, a relatively lower current is passed through electrode 108 for a relatively longer duration. This current generates a relatively lower amount of heat in structures 305 for a relatively longer period of time.

In one embodiment, providing multiple pillars including both heater structures and phase change structures in a cell provides for more efficient heating and more complete amorphization of the phase change structures. Furthermore, in this embodiment, the phase change material does not have any component that is located lateral to a heater structure of the cell. For example, in FIG. 13, each phase change structure 303 is located only over a corresponding heater structure 305. There is no portion of phase change structure 303 that extends laterally from the area of a heater structure 305.

In the embodiment shown, the lack of lateral phase change material of structures 303 to structures 305 may, in some embodiments, reduce the probability of current leakage paths caused by multiple nuclei of crystalline material embedded in an amorphous matrix when the phase change material is in an amorphous state. For example, if all of the phase change structures 303 of cell 1311 were connected in a single layer, then there would be phase change material located laterally to the heater structures of pillars 301. With such a case, the material that is lateral to the heater structures 305 is less likely to be amorphized. Such a condition may bring about more leakage current.

Furthermore, having crystalline structures in a material when an amorphous phase is desired may lead to a loss of bit integrity over time (especially at elevated operating temperatures). The crystalline structures may act as a seed for the undesirable crystallization of the amorphous material. With a more complete amorphization, there is a reduced probability of undesirable crystallization.

In one embodiment, electrodes 108 and 112 are electrically coupled to a transistor (not shown) whose gates are connected to word lines. Electrodes 1301 and 1305 may be electrically connected to bit lines. However, the electrodes of a memory cell may be configured differently in other embodiments. For example, in some embodiments, electrodes 108 and 112 may be electrically coupled to a current electrode (e.g. source or drain of a FET) of a transistor. In one embodiment, heater material layer 109 may be formed on a current electrode of a transistor. In one such example, layer 109 would be formed on a silicide of a current electrode.

In another embodiment, conductive electrodes 108 and 112 may be located in higher metal layers of a wafer.

After the stage shown in FIG. 13, further processes may be performed on wafer 101. For example, further structures may be formed on wafer 101 such as interlayer dielectrics and additional metal layers. Also, bond pads or other external electrical conductors and passivation layers may be formed on wafer 101. Afterwards, wafer 101 may be singulated (e.g. with a wafer saw) into multiple integrated circuits with each integrated circuit including multiple memory cells similar to memory cells 1311 and 1313. In some embodiments, the memory cells would be arranged in one or more arrays. However, other integrated circuits may have other arrangements or include other structures in other embodiments.

In some embodiments, using nanoclusters for patterning pillars 301 enables the formation of pillars having a width of less than 20 nm. The formation of such small pillars enables a reduction in the current required to amorphize a phase change memory cell. The smaller width of the heater structures provides for a higher resistance of those structures, thereby producing more heat with the same amount of current than a memory cell with larger heater structures. Furthermore, using nanoclusters for patterning allows for phase change structures to have widths of less than 20 nm.

In another embodiment, layer 113 may be patterned by using di-block co-polymers instead of nanoclusters 115. In such an embodiment, the di-block co-polymers are spin coated on layer 113 and then annealed where the two polymers phase separate into well defined structures. The structures of one of the polymers is etched away leaving isolated structures of the second polymer. These isolated structures are then used to pattern the underlying layers to form pillars. With some embodiments utilizing co-polymers, pillars having a width as low as 20 nanometers may be achieved.

In some embodiments, in order to crystallize phase change material structures 303 during programming, a high current is applied to completely melt all of phase change material structures 303 followed by a slow ramp down of the current to crystallize the phase change material. in one embodiment, the current is at value sufficient to produce a temperature which exceeds the melting temperature of the phase change material. The ramp down time would be material dependent as well.

FIGS. 14-22 show various partial side views of another embodiment of the present invention. In this embodiment, the phase change material is not formed with each pillar but instead is deposited as a layer of material that forms between the pillars of the heater structures.

Figure 14:
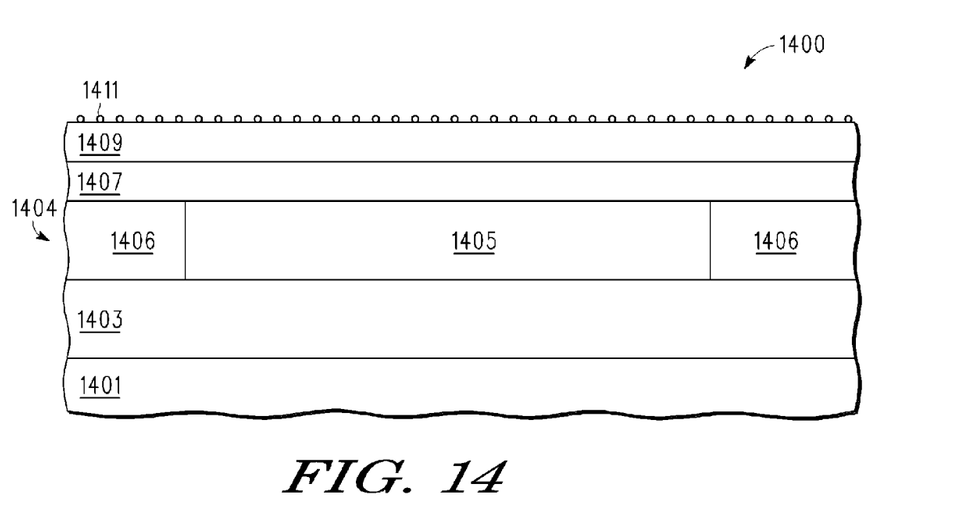
FIGS. 14-22 show side cut away views of various stages in the manufacture of a phase change memory cell according to another embodiment of the present invention.

FIG. 14 shows a partial side view of wafer 1400. Wafer 1400 includes a substrate 1401, a dielectric layer 1403, a first metal layer 1404 including a conductive electrode 1405 isolated by dielectric 1406. A layer of heater material 1407 is located over layer 1404. Layer 1407 may be similar to layer 109. A masking layer 1409 (e.g. nitride) is formed over layer 1407. Nanoclusters 1411 are located on layer 1409. In one embodiment, nanoclusters 1411 are similar to nanoclusters 115 including having similar widths and spacings.

Figure 15:
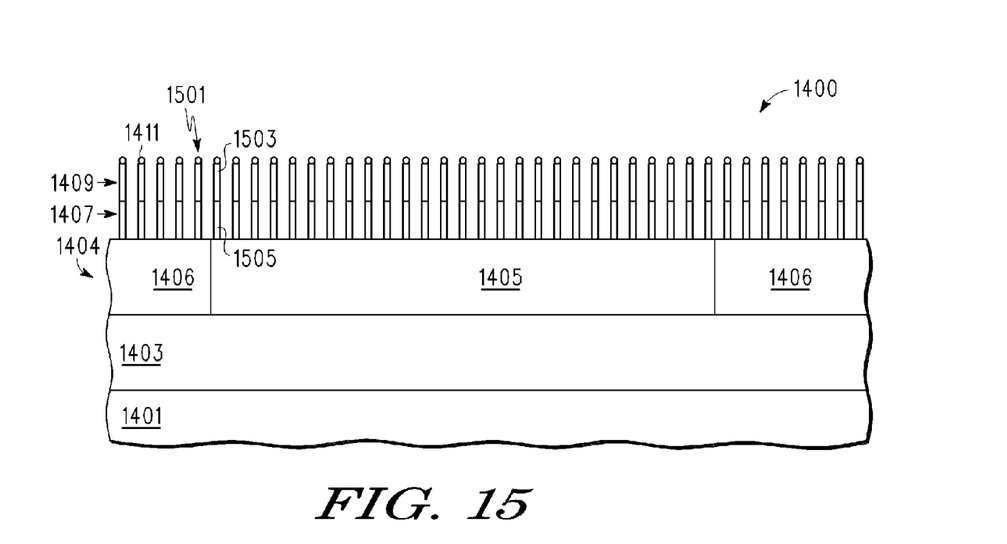

FIG. 15 shows wafer 1400 after layers 1409 and 1407 have been patterned as per the pattern of nanoclusters 1411 to form pillars 1501. Each pillar 1501 includes a mask structure 1503 and a heater structure 1505.

Figure 16:
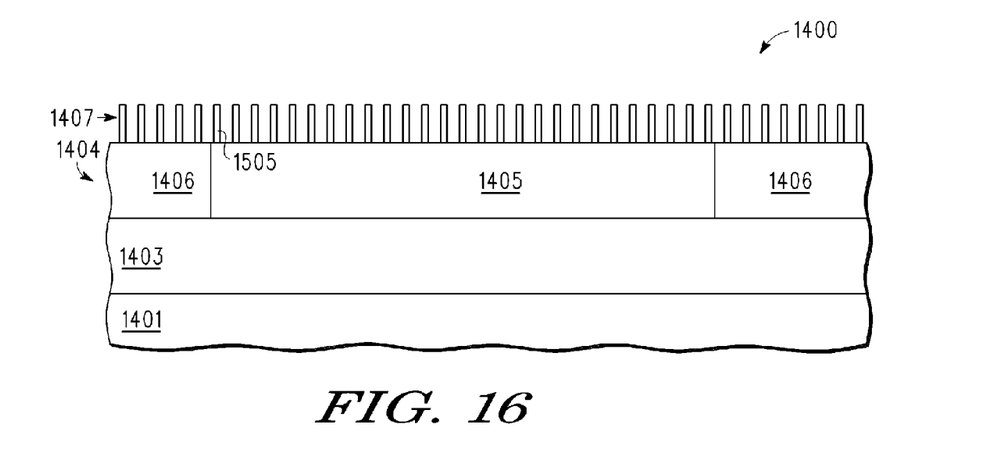

FIG. 16 shows wafer 1400 after structures 1503 and nanoclusters 1411 have been removed (e.g. by a wet etch of an etchant selective to the material of layer 1409).

Figure 17:
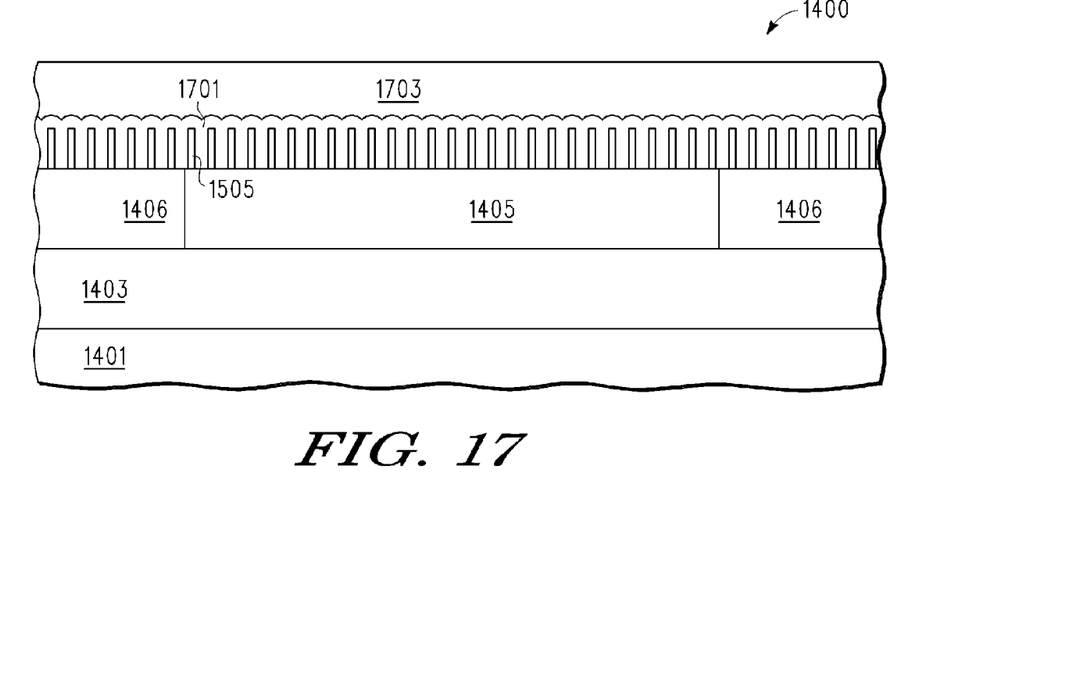

FIG. 17 shows wafer 1400 after a layer of phase change material layer 1701 is deposited over wafer 1400 followed by a layer 1703 of capping material (e.g. nitride). In one embodiment, layer 1701 is made of a material similar to those describe above for layer 111. In one embodiment, layer 1701 is deposited by physical vapor deposition (PVD) where the phase change material is deposited between the heater structures 1505. In one embodiment, layer 1701 has a thickness sufficient to cover the top of heater structures 1505 by 3-5 nm. However, other thicknesses may be used in other embodiments.

Figure 18:
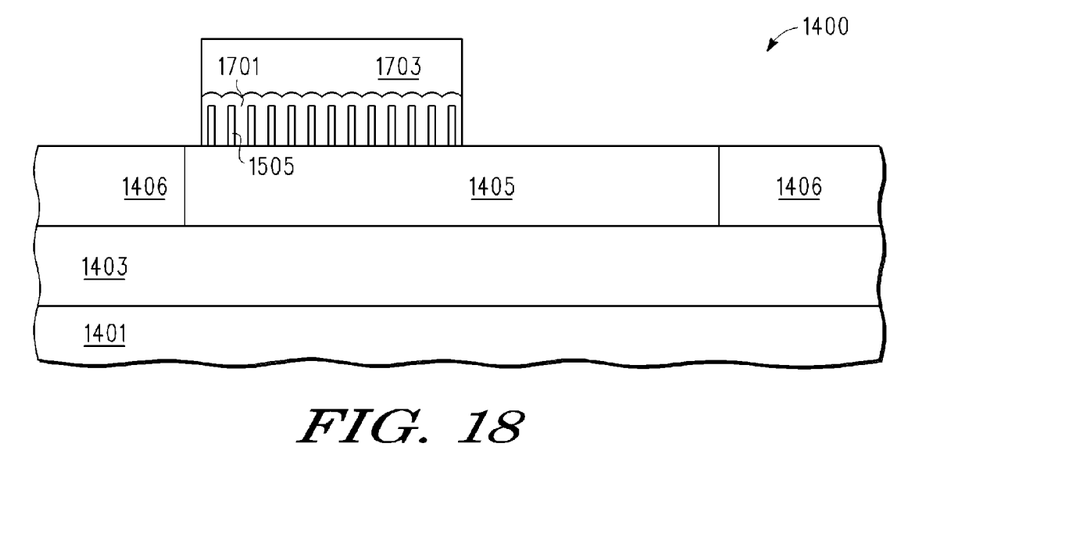

FIG. 18 shows wafer 1400 after layer 1703, layer 1701, and structures 1505 are patterned thereby leaving portions of electrode 1405 and dielectric 1406 exposed.

Figure 19:
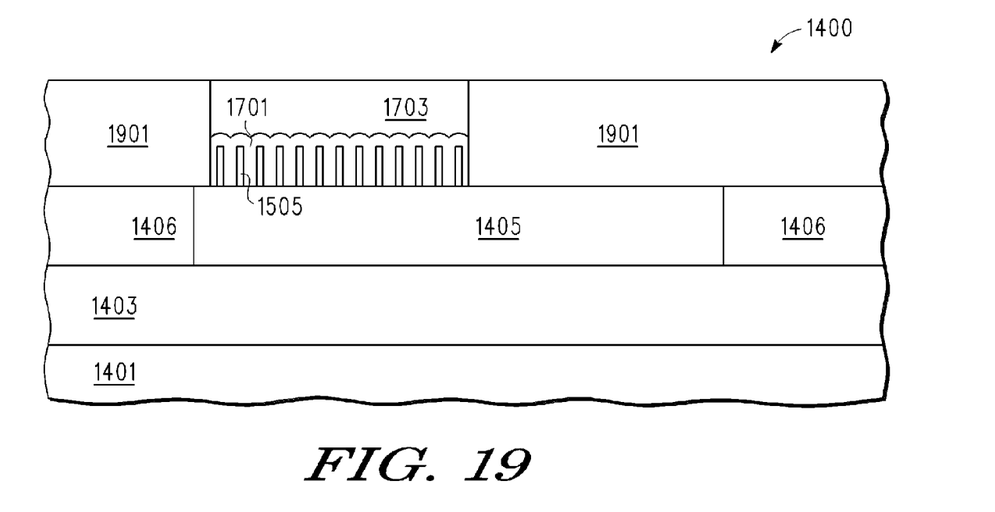

FIG. 19 shows wafer 1400 after a layer of dielectric material 1901 is formed over wafer 1400 and planarized using layer 1703 as a planarizing stop.

Figure 20:
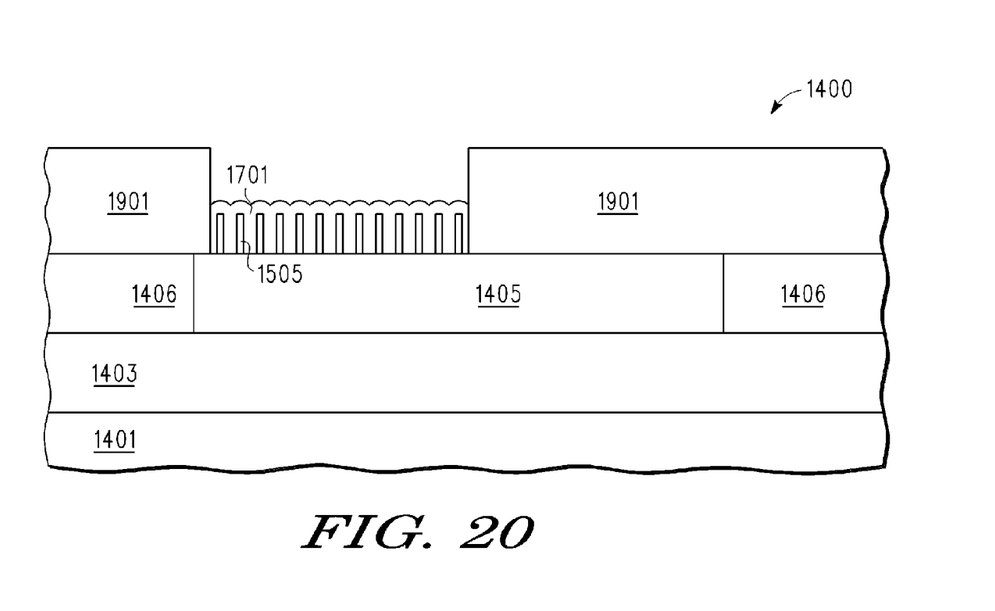

FIG. 20 shows wafer 1400 after layer 1703 is removed to expose layer 1701. In some embodiments, the layer 1701 may include a conductive barrier capping layer such as tungsten or titanium nitride. In such cases, the etch process for removal of layer 1703 stops on the conductive barrier capping layer, thereby protecting the underlying material of layer 1701 from the etch chemistry.

Figure 21:
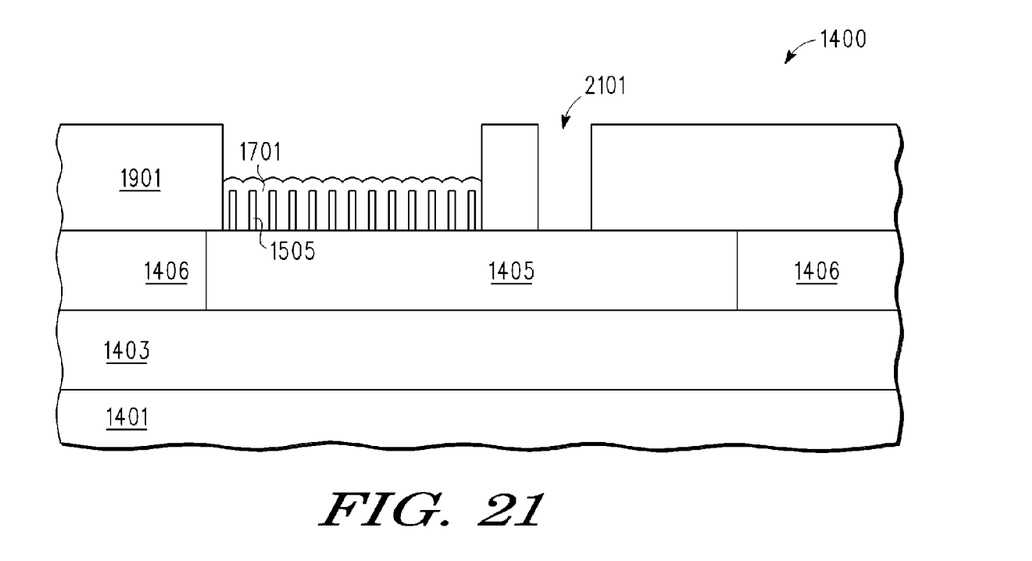

FIG. 21 shows wafer 1400 after an opening 2101 is formed to expose electrode 1405. This electrode is exposed by patterning a mask layer (not shown) to form an opening and then removing the material of layer 1901 using the patterned mask layer. Afterwards, the patterned mask layer is removed.

Figure 22:
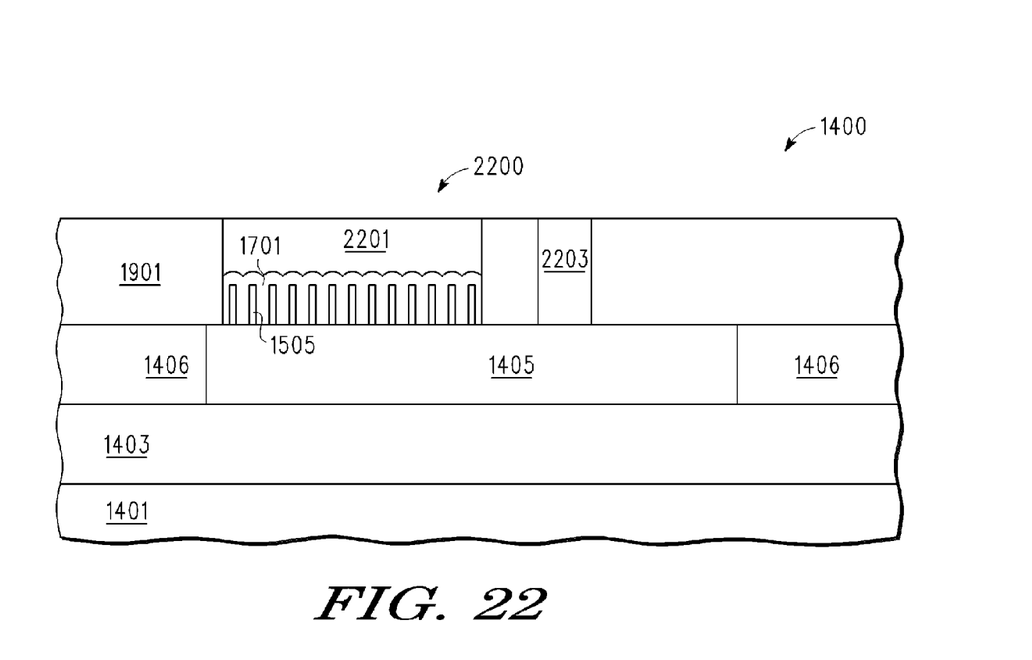

FIG. 22 shows wafer 1400 after electrode 2201 and contact 2203 are formed. Electrode 2201 and contact 2203 are formed by depositing a layer of conductive material (e.g. copper, gold, aluminum) over wafer 1400 followed by planarization using layer 1901 as a planarization stop. In some embodiments, contact 2203 and electrode 2201 may include barrier layers (not shown).

Memory cell 2200 includes a structure with multiple heater structures 1505 each surrounded by phase change material layer 1701. Providing a heater with multiple pillar structures surrounded by phase change material provides for a greater amount of phase change material surface to heater surface contact. Accordingly, phase change layer 1701 may be more amorphized during an amorphization writing process in that a greater portion of that layer is in contact with heater structures as opposed to where layer 1701 is located above the heater structures. In some embodiments, this ability to better amorphize the phase change material results in better reliability of the cell at high temperatures. In addition, this configuration provides for a more efficient use of heat generated by the heater structures 1505 in that a heater structure heats phase change material located laterally to it as well as above it (as with the embodiment of FIG. 13). In some embodiments, the multiple pillars of heater material may reduce the amount of current required to amorphize the phase change layer 1701.

Modifications may be made to the embodiment of FIG. 22. For example, FIG. 23 shows wafer 2300 which is similar to wafer 1400 with substrate 2301, layer 2303, dielectric 2307, electrode 2305, dielectric 2323, contact 2321, and electrode 2319 being similar to substrate 1401, layer 1403, dielectric 1406, electrode 1405, dielectric 1901, contact 2203, and electrode 2201, respectively.

Figure 23:
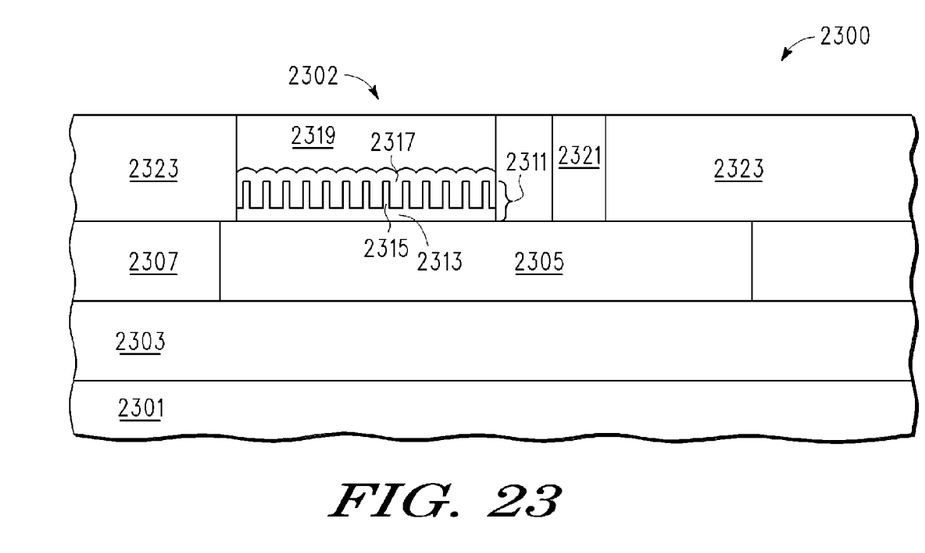
FIG. 23 shows side cut away view of a stage in the manufacture of a phase change memory cell according to another embodiment of the present invention.

However in the embodiment of FIG. 23, layer 2311 of heater material (which may be a material similar to layer 1407 of FIG. 14) is not completely etched to electrode 2305. Instead heater layer 2311 is etched for a predetermined duration to provide heater pillar structures 2315 located over unetched layer portion 2313. With this embodiment, phase change material 2317 does not contact electrode 2305. Thus, all writing current has to pass through a heater material of layer 2311 prior to passing though layer 2317.

In some embodiments, layer 2311 may be made of two etch selectable layers of heater material (e.g. titanium tungsten and titanium nitride) where the top layer would be etched to form pillar structures (e.g. like structures 2315) and the bottom layer would not be etched such that it appears like portion 2313. In this embodiment, the etchings to form the heater pillar structures 2315 would not be a timed etch or a time critical etch.

In some embodiments, pillars 301 of FIG. 13 are located over a portion of heater material similar to portion 2313.

In another embodiment of FIG. 22, layer 1701 may be planarized. In some embodiments, a planarizing stop material would be located on each of structures 1505. In some embodiments, electrode 2201 would contact the planarizing stop material. In some embodiments, this planarizing stop material would be a dielectric material such that electrode 2201 would not be in contact with structures 1505. These same modifications may be made to the embodiment of FIG. 23.

As further modifications of FIGS. 13, 22 and 23, the locations of the heater structures and phase change structures may be reversed. Referring for FIG. 13, in one example of such a modification, pillar structures 305 would be of a phase change material and pillar structures 303 would be of a heater material. Referring to FIG. 22, in another example of such a modification, structures 1505 would be of a phase change material and layer 1701 would be of a heater material. Referring to FIG. 23, in another example of such a modification, layer 2311 would be of a phase change material and layer 2317 would be of a heater material.

Providing multiple pillars with spacing of less than 20 nm between pillars provides for a large number of heater pillars to be incorporated in each cell. Accordingly, phase change layer 1701 may be more amorphized during an amorphization writing process in that a greater number of heater pillars are in contact with layer 1701 as opposed to the case where the spacing between adjacent heater pillars is large. In other embodiments, the number of pillars in a phase change memory cell may be of a lesser number.

In one embodiment, a phase change memory cell includes a first electrode, a second electrode, and a plurality of pillars located between the first electrode and the second electrode. Each of the plurality of pillars having a first end electrically coupled to the first electrode and a second end electrically coupled to the second electrode. Each of the plurality of pillars includes a heater material portion and a phase change material portion.

In another embodiment, a method of forming a phase change memory cell includes forming a first electrode layer over a substrate, forming a plurality of pillars electrically coupled to and over the first electrode layer. Each of the plurality of pillars including a phase change material portion and a heater material portion. The method also includes forming a second electrode electrically coupled to each of the plurality of pillars.

In another embodiment, a phase change memory cell includes a first electrode, a second electrode, and a plurality of pillars between the first electrode and the second electrode. Each of the plurality of pillars including a first end electrically coupled to the first electrode and a second end electrically coupled to the second electrode. Each of the plurality of pillars comprises a heater material portion and a phase change material portion and each of the plurality of pillars has a width of less than 20 nanometers. The phase change memory cell also includes an insulating material around each of the plurality of pillars.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of forming a phase change memory cell, comprising:
   forming a first electrode layer over a substrate;
   forming a plurality of pillars electrically coupled to and over the first electrode layer, wherein each of the plurality of pillars including a phase change material portion and a heater material portion; and
   forming a second electrode electrically coupled to each of the plurality of pillars.

2. The method of claim 1, wherein the step of forming the plurality of pillars is further characterized by the phase change material portion being over the heater material portion.

3. The method of claim 1, wherein the step of forming the plurality of pillars is further characterized by the phase change material portions comprising at least one of a group consisting of germanium, antimony, and tellurium.

4. The method of claim 1, wherein the step of forming the plurality of pillars is further characterized by:
   forming layer of heater material over the first electrode layer;

forming a layer of phase change material over the layer of heater material;

etching through the layer of phase change material; and etching at least partially through the layer of heater material.

5. The method of claim 1, wherein the step of forming the plurality of pillars is further characterized by:

forming layer of heater material over the first electrode layer;

forming a layer of phase change material over the first electrode layer;

providing nanoclusters over the layer of heater material and over the layer of phase change material, wherein the nanoclusters define a pattern;

etching through the layer of phase change material as per the pattern; and etching at least partially through the layer of heater material as per the pattern.

6. The method of claim 1 further comprising:

forming a layer of heater material, wherein the heater material portion of each pillar of the plurality of pillars is formed from the layer of heater material, forming a layer of phase change material wherein the phase change material portion of each of the plurality of pillars is formed from the layer of phase change material;

providing nanoclusters over the layer of heater material and over the layer of phase change material, wherein the nanoclusters define a pattern;

wherein a location of the plurality of pillars is defined as per the pattern.

7. The method of claim 1, wherein the step of forming the plurality of pillars is further characterized by the plurality of pillars each having a width of less than 20 nanometers.

8. The method of claim 1, wherein the step of forming the plurality of pillars is further characterized by the plurality of pillars having a spacing of less than 20 nanometers.

9. The method of claim 1, further comprising forming an insulating material surrounding each of the plurality of pillars.

10. The method of claim 1, wherein the step of forming the plurality of pillars is further characterized by the phase change material portions comprising a combination including a first material and a second material, wherein:

the first material is one of a class group consisting of a group IB material, a group III material, a group IV material, a group V material, and a group VI material;

the second material is one of the class group but not a same group of the class group as the first material.

11. The method of claim 1, wherein the step of forming the plurality of pillars is further characterized by the heater material portions including at least one of a group consisting of titanium, aluminum, nitrogen, silicon, tantalum, and tungsten.

* * * * *